United States Patent
Kunii (10) Patent No.: US 6,569,720 B2
(45) Date of Patent: May 27, 2003

(54) METHOD FOR FABRICATING THIN-FILM TRANSISTOR

(75) Inventor: Masafumi Kunii, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/238,899

(22) Filed: Jan. 28, 1999

(65) Prior Publication Data

US 2002/0055207 A1 May 9, 2002

(30) Foreign Application Priority Data

Feb. 18, 1998 (JP) .......................................... 10-054404

(51) Int. Cl.[7] .......................... H01L 21/00; H01L 21/84
(52) U.S. Cl. ........................ 438/151; 438/163; 257/348
(58) Field of Search ................................. 438/149, 158, 438/161, 30, 160, 151, 163, FOR 204, FOR 205; 257/348, 65, 66, 72

(56) References Cited

U.S. PATENT DOCUMENTS

| | | | | |
|---|---|---|---|---|
| 5,397,718 A | * | 3/1995 | Furuta et al. ................ | 438/161 |
| 5,581,092 A | * | 12/1996 | Takemura ..................... | 257/65 |
| 5,756,372 A | * | 5/1998 | Wakui et al. ................. | 438/30 |
| 5,771,110 A | * | 6/1998 | Hirano et al. ................. | 257/72 |
| 6,020,224 A | * | 2/2000 | Shimogaichi et al. ........ | 438/158 |
| 6,031,249 A | * | 2/2000 | Yamazaki et al. ............ | 257/66 |
| 6,121,660 A | * | 9/2000 | Yamazaki et al. .......... | 257/348 |

OTHER PUBLICATIONS

Wolf, "Silicon Processing For The VLSI ERA", vol. 2 1990, Lattice Press, pp 305 and 309.*

* cited by examiner

Primary Examiner—William David Coleman
(74) Attorney, Agent, or Firm—Sonnenschein, Nath & Rosenthal (57) ABSTRACT

Threshold voltage (Vth) control in thin-film transistors is facilitated. The thin-film transistor has a laminate structure comprising a thin-film polycrystalline semiconductor, a gate oxide film as formed adjacent to one surface of the semiconductor film, and a gate electrode as laminated on the thin-film polycrystalline semiconductor via the gate oxide film. The method for fabricating the thin-film transistor comprises an implantation step of selectively implanting a dopant in the thin-film semiconductor to form a source region and a drain region of the thin-film transistor, and a rapid thermal annealing (RTA) step of activating the implanted dopant through controlled RTA for Vth control in the thin-film transistor. The RTA step comprises gradually heating the insulating substrate, then exposing the thin-film semiconductor to ultraviolet rays for rapidly heating it, and thereafter gradually cooling it.

8 Claims, 6 Drawing Sheets

FIG. 7

METHOD FOR FABRICATING THIN-FILM TRANSISTOR

BACKGROUND OF THE INVENTION

1. Field of the Invention

The present invention relates to a method for fabricating a thin-film transistor having, as the active layer, a thin semiconductor film of, for example, polycrystalline silicon or the like as formed on an insulating substrate. For example, it relates to a method for fabricating a thin-film transistor to be used as a switching element in active matrix-type display devices. More precisely, the invention relates to a method for fabricating a thin-film transistor in a low-temperature process (in which, for example, the highest processing temperature is not higher than 600° C.). Further more precisely, it relates to a threshold voltage control technique for thin-film transistors.

2. Description of the Related Art

Thin-film transistors are widely used as switching elements in active matrix-type, liquid-crystal display devices. Heretofore, in particular, polycrystalline silicon has been being employed for thin semiconductor films to be the active layers in thin-film transistors. Polycrystalline silicon thin-film transistors can be used not only for switching elements but also for circuit elements. Using them, therefore, makes it possible to construct both switching elements and peripheral driving circuits on one and the same substrate. In addition, polycrystalline silicon thin-film transistors can form fine patterns. With their fine patterns, therefore, the area for the switching elements in pixel structures can be reduced and the pixel apertures therein can be enlarged. Heretofore, in the process of fabricating polycrystalline silicon thin-film transistors, the highest processing temperature reaches around 1000° C. For those thin-film transistors, therefore, quartz glass and the like with good heat resistance are used as insulating substrates. Because of the problem intrinsic to the high-temperature process, glass substrates having a relatively low melting point are difficult to use for them. However, use of low-melting-point glass materials is indispensable for reducing the production costs for liquid-crystal display devices. Recently, therefore, a so-called low-temperature process has been being developed for fabricating polycrystalline silicon thin-film transistors, in which the highest processing temperature is not higher than 600° C. In particular, for fabricating large-sized liquid-crystal display devices, such a low-temperature process is extremely advantageous as being inexpensive.

For one step of the low-temperature process, an ion-showering technique has heretofore been developed, which is for dopant implantation at relatively low temperatures. Not requiring mass separation, all ions are implanted in a large-area thin-film semiconductor through ion-showering. However, in the ion-showering apparatus with no mass separation, even ions (hydrogen ions, etc.) except those of the intended dopant are also implanted in semiconductor films, in which, therefore, it is difficult to accurately control low-dose ions of smaller than $1 \times 10^{14}/cm^2$. Dopant ion implantation at a low dose of not larger than $1 \times 10^{14}/cm^2$ is necessary for threshold voltage (Vth) control for thin-film transistors. In fabricating thin-film transistors for large-area liquid-crystal displays, especially those for active matrix-type liquid-crystal displays at a processing temperature of not higher than 600° C., Vth control is indispensable for ensuring the intended electric characteristics of the devices. However, in conventional ion-showering systems, accurate control of low-dose ions is impossible. In that situation, recently, a different type of ion implantation apparatus has been developed, in which dopant ions having been subjected to mass separation are implanted in a thin-film semiconductor formed on a large-area insulating substrate. In one example of the apparatus, dopant ions are subjected to mass separation while being aligned in line beams of from 300 to 600 nm, prior to being implanted in semiconductor films. In that apparatus, relatively low-dose ion implantation is possible even in large-size glass substrates of 600×720 mm square or so. Low-dose implantation with the ion implantation apparatus of that type, which is directed to Vth control for thin-film transistors, is herein referred to as Vth ion implantation. This technique is disclosed, for example, in JP-A-3-6865.

Vth ion implantation for thin-film transistors generally comprises selective, low-dose pre-implantation of, for example, boron ions $B^+$ in a part of thin semiconductor films to be the active layers (channel region) of thin-film transistors. However, Vth of thin-film transistors is greatly influenced not only by the boron ion concentration of $B^+$ in the active, thin-film semiconductor layers but also by the grain size of the polycrystalline silicon grains constituting the thin-film semiconductor and even by the defect level density in the interface of polycrystalline silicon/silicon dioxide. Therefore, for good Vth control in thin-film transistors with no substantial Vth fluctuation therein, the conventional Vth ion implantation is problematic in that it could not meet the requirement for the intended Vth control.

SUMMARY OF THE INVENTION

The present invention is to solve the problem with the related art noted above, and its object is to provide a method for fabricating a thin-film transistor, in which more accurate Vth control in the thin-film transistor fabricated is possible. To attain the object, we, the inventors have taken the measures mentioned below, and have completed the invention. Specifically, the invention is a method for fabricating a thin-film transistor having a laminate structure that comprises a thin-film semiconductor, a gate-insulating film as formed adjacent to one surface of the thin-film semiconductor, and a gate electrode as laminated on the thin-film semiconductor via the gate-insulating film, and is formed on an insulating substrate. The method comprises an implantation step of selectively implanting a dopant in the thin-film semiconductor to form a source region and a drain region of the thin-film transistor, and a rapid thermal annealing (RTA) step of activating the implanted dopant through controlled RTA for Vth control in the thin-film transistor. Preferably, the method comprises, prior to the implantation step, an optional pre-implantation step of selectively implanting a dopant at least in the part of the thin-film semiconductor to be the channel region of the thin-film transistor, thereby controlling the Vth of the thin-film transistor. The pre-implantation step is combined with the RTA step to optimize the Vth control in the thin-film transistor to be fabricated in the method. Also preferably, the RTA step comprises gradually heating the insulating substrate, then exposing the thin-film semiconductor to ultraviolet rays for rapidly heating it, and thereafter gradually cooling it.

To activate the dopant having been implanted in thin-film semiconductors, excimer lasers have heretofore been used for laser activation annealing. Being different from this, RTA is employed in the invention. RTA is for activating the dopant in thin-film semiconductors through short exposure to light of which the wavelength falls within an ultraviolet range. The intrinsic object of RTA is for dopant activation.

However, we, the inventors have found that Vth of thin-film transistors greatly varies depending on the condition for RTA. RTA produces a sound $SiO_2$ structure in gate-insulating films, and reduces the defect level density in the interface between a thin-film semiconductor of polycrystalline silicon and $SiO_2$, and even reduces the intergranular and intragranular defect level density of polycrystalline silicon grains. In RTA, the degree of boron ion activation for $B^+$ having been previously implanted into thin-film semiconductors through Vth ion implantation also greatly depends on the defect level density noted above. Therefore, Vth of thin-film transistors can be controlled as a result of reducing the defect level density in the interface of polycrystalline silicon/$SiO_2$ and reducing the intergranular and intragranular defect level density of polycrystalline silicon grains. As mentioned above, Vth of thin-film transistors greatly depends on essentially the dose in Vth ion implantation and the RTA condition. In the invention, Vth ion implantation is appropriately combined with RTA to optimize the condition for Vth control in the thin-film transistors fabricated.

DESCRIPTION OF THE PREFERRED EMBODIMENTS

Preferred embodiments of the invention are described in detail with reference to the drawings attached hereto. FIG. 1A to FIG. 1D show one embodiment of the method of the invention for fabricating a thin-film transistor. In this embodiment, fabricated is an n-channel type, thin-film transistor, but the same steps as those illustrated herein shall apply to the fabrication of p-channel type ones in which only the dopant type to be used is changed. The illustrated steps are for fabricating a bottom-gate structured, thin-film transistor as one example of the invention. First, as in FIG. 1A, a layer of, for example, Al, Ta, Mo, W, Cr, Cu or their alloys is formed to have a thickness of from 100 to 200 nm, on an insulating substrate 0 of glass or the like, and is patterned to give a gate electrode 1.

Figure 1A:
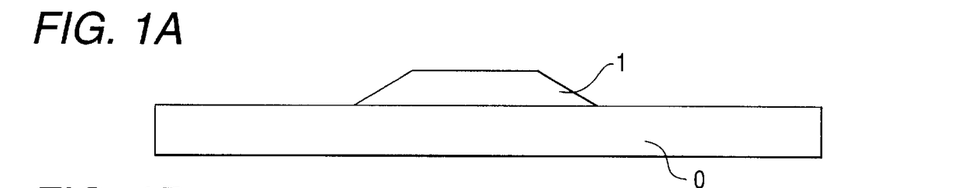
FIG. 1A to FIG. 1D are graphical views showing the first embodiment of the method for fabricating a thin-film transistor of the invention.
Figure 1B:
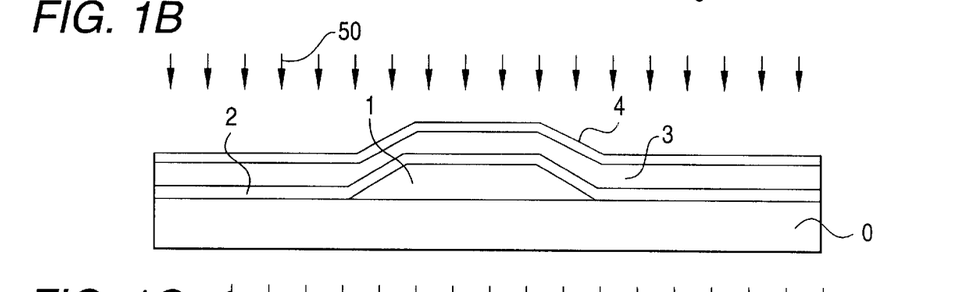

Next, as in FIG. 1B, a gate-insulating film is formed over the gate electrode 1. In this embodiment, the gate-insulating film formed has a two-layered structure of, for example, gate nitride layer 2 ($SiN_x$)/gate oxide layer 3 ($SiO_2$). The gate nitride layer 2 is formed through plasma CVD (PCVD) for which is used, for example, a vapor mixture of $SiH_4$ gas and $NH_3$ gas. In place of PCVD, any of normal-pressure CVD or reduced-pressure CVD is employable. In this embodiment, the gate nitride layer 2 is formed to have a thickness of 50 nm as one example. Continuously after the formation of the gate nitride layer 2, the gate oxide layer 3 is formed thereon to have a thickness of about 200 nm. On the gate oxide layer 3, further continuously formed is a thin semiconductor film 4 of amorphous silicon to have a thickness of about 30 to 80 nm or so. The two-layered gate-insulating film of layers 2 and 3, and the thin, amorphous semiconductor film 4 are formed in such a continuous film-forming manner without breaking the vacuum condition in the film-forming chamber used. After the film-forming process of PCVD as above, the substrate with the films formed thereon is heated, for example, in a nitrogen atmosphere at a temperature falling between 400 and 450° C. for 1 hour or so, whereby hydrogen having existed in the thin, amorphous semiconductor film 4 is released from the film 4. This treatment is generally referred to as dehydrogenation annealing.

Vth ion implantation is effected for Vth control in the thin-film transistor to be fabricated herein. In this embodiment, boron ions $B^+$ are implanted, for example, at a dose falling between $1 \times 10^{12}$ and $6 \times 10^{12}/cm^2$ or so for the Vth ion implantation for that purpose, in which, for example, ion line beams of 620 nm in width are used. Next, the thin, amorphous semiconductor film 4 is crystallized through exposure to laser rays 50. As the laser rays 50, for example, used are excimer laser beams. This laser annealing is effective for crystallizing the thin semiconductor film at a processing temperature not higher than 600° C. In this embodiment, for example, laser rays 50 having been excited in pulse of rectangular or strip beams are irradiated onto the thin, amorphous semiconductor film 4 to crystallize it. After this, the thin semiconductor film is patterned in accordance with the element regions of the thin-film transistor to be fabricated.

Figures 1C, 1D:
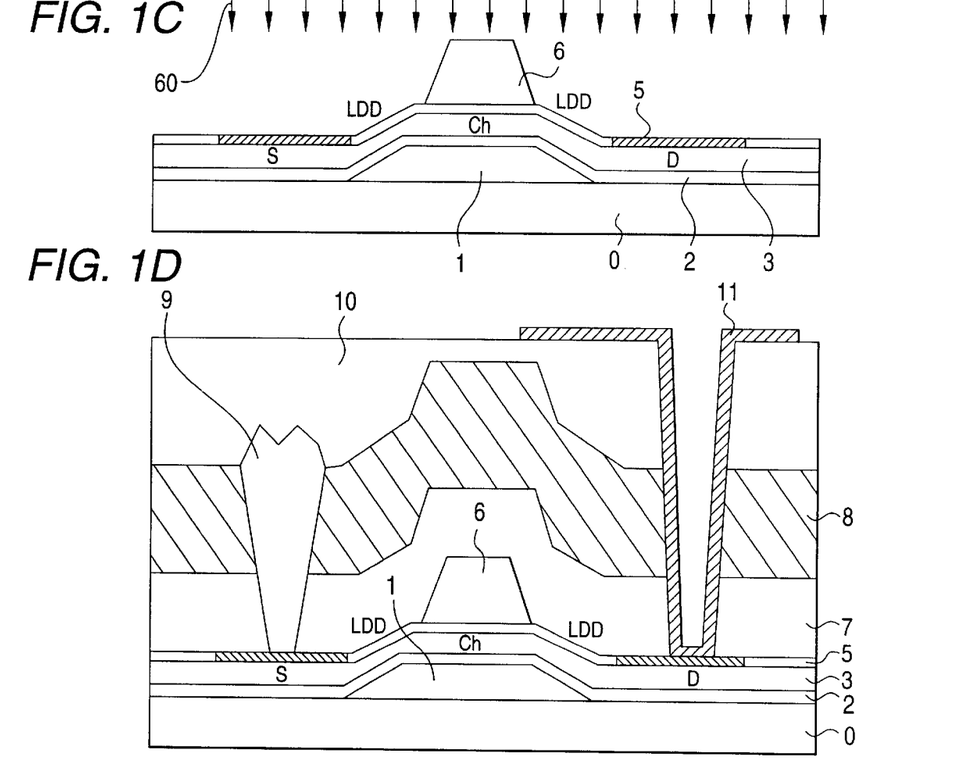

Next, as in FIG. 1C, a film of $SiO_2$ is formed on the thin, polycrystalline silicon semiconductor film 5 having been crystallized in the previous step, for example, through PCVD to have a thickness of approximately from 100 nm to 300 nm or so. This $SiO_2$ film is then patterned to have a predetermined shape, thereby giving an etching stopper film 6. In this case, the etching stopper film 6 is so patterned through back-surface exposure that it is aligned with the gate electrode 1. The part of the thin, polycrystalline semiconductor film 5 just below the etching stopper film 6 is protected to be a channel region Ch. As so mentioned hereinabove, the channel region Ch has previously received a relatively low dose of boron ions $B^+$ in the Vth ion implantation. Next, via the etching stopper film 6 acting as a mask, a dopant (for example, phosphorus ions $P^+$) is implanted in the thin semiconductor film 5 through ion doping to form a light doped drain (LDD) region. The dose in this step is, for example, from $6 \times 10^{12}$ to $5 \times 10^{13}/cm^2$ or so. Next, a photo-resist is patterned to cover the stopper film 6 and the LDD region adjacent to the both sides of the film 6. Via this photo-resist pattern acting as a mask, a high dose of a dopant (for example, phosphorus ions $P^+$) is implanted in the thin semiconductor film 5 to form a source region S and a drain region D. The dopant implantation may be effected, for example, through ion doping (ion showering). This is to implant the dopant in an accelerated electric field with no mass separation applied to the dopant. In the present embodiment, the dopant is implanted at a dose of $1 \times 10^{15}/cm^2$ or so to form the source region S and the drain region D. Though not shown herein, a p-channel type, thin-film transistor may be fabricated as follows: The region for the n-channel type, thin-film transistor is masked with a photo-resist. The dopant source of phosphorus ions P$^+$ is switched to that of boron ions B$^+$, and the latter ions B$^+$ are implanted in the thin semiconductor film at a dose of $1\times10^{15}/cm^2$ or so through ion doping. For the dopant implantation, a mass separation-combined ion implantation apparatus may be employed.

After this, the dopant having been implanted in the thin, polycrystalline semiconductor film 5 is activated through RTA 60. Heretofore, laser activation annealing with excimer lasers has been employed for the activation. In place of this, however, RTA is employed in the present invention for activating the dopant. For RTA 60 herein, the thin, polycrystalline semiconductor film 5 is exposed to light, of which the wavelength falls within an ultraviolet region, for a short period of time, thereby activating the dopant having been implanted in the film 5. The heating temperature may be well unified in RTA, and RTA is therefore advantageous in that the electric resistance in the LDD region formed is prevented from fluctuating, and the throughput in RTA is higher than that in laser activation annealing with excimer lasers. Being different from laser activation annealing for which excimer lasers are irradiated onto a glass substrate with their pulse being scanned relative to the substrate, RTA may be effected in such a manner that ultraviolet rays from an arc lamp are instantaneously irradiated onto the glass substrate for only an extremely short period of time (for example, 1 second or so) to rapidly heat and anneal the thin, polycrystalline semiconductor film 5. We, the inventors have found that RTA activates the dopant and, in addition, the Vth of the thin-film transistor being fabricated greatly varies depending on the condition for RTA. RTA produces sound $SiO_2$ that constitutes the gate oxide film 3 and the etching stopper film 6. In addition, RTA reduces the defect level density in the interface between the thin, polycrystalline semiconductor film 5 and the gate oxide film 3, and even in the interface between the thin, polycrystalline semiconductor film 5 and the etching stopper film 6. Moreover, RTA further reduces the intergranular and intragranular defect level density of polycrystalline silicon grains in the thin, polycrystalline semiconductor film 5. On the other hand, the degree of activation of the boron ions B$^+$ having been previously implanted in the channel region Ch for Vth control also greatly depends on the defect level density mentioned above. As a result, the dopant having been implanted in the source region S and the drain region D is activated through RTA, while, at the same time, the Vth of the thin-film transistor being fabricated is well controlled in RTA. As so mentioned hereinabove, the Vth of the thin-film transistor being fabricated herein greatly depends on essentially the dose of boron ions B$^+$ in Vth ion implantation and the RTA condition. Therefore, for Vth control in the thin-film transistor, the optimum condition must be determined relative to the combination of Vth ion implantation and RTA.

Finally, as in FIG. 1D, a film of $SiO_2$ is formed to have a thickness of about 200 nm. This is an interlayer insulating film 7. On the interlayer insulating film 7 thus formed, a film of, for example, $SiN_x$ is formed through PCVD to have a thickness of approximately from 200 to 400 nm or so. This is a passivation film (cap film) 8. In this stage, the thus-processed substrate is heated in a nitrogen gas or foaming gas atmosphere or in a vacuum atmosphere at about 350° C. or so, for example, for 1 hour or so, whereby hydrogen atoms in the interlayer insulating film 7 are diffused out into the thin semiconductor film 5. After this, a contact hole is formed, and a film of, for example, Mo, Al or the like is formed through sputtering to have a thickness of from 200 to 400 nm. Then, the film is patterned to give a wiring electrode 9. Next, a planarizing layer 10 of, for example, acrylic resin or the like is formed to have a thickness of 1 $\mu$m or so, and a contact hole is formed. Over the planarizing layer 10, a transparent conductive film of, for example, ITO (indium-tin-oxide), IXO (indium-zinc-oxide) or the like is formed through sputtering, and is patterned to have a predetermined shape, thereby giving a pixel electrode 11.

Figure 2:
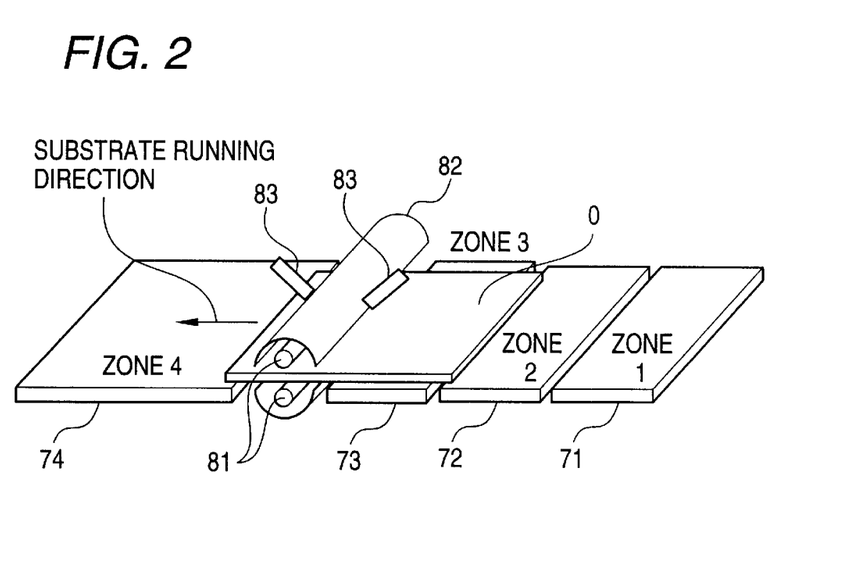
FIG. 2 is a conceptual view showing an RTA apparatus to be used in carrying out the invention.

FIG. 2 shows an RTA apparatus to be used for the process of RTA mentioned above. RTA is a technique of realizing high-temperature thermal treatment (at temperatures falling between 500 and 700° C. or so), in which, for example, ultraviolet rays having a wavelength of from 240 to 400 nm are instantaneously (for example, for 1 second or so) irradiated onto the insulating substrate 0 of glass or the like with no damage to the substrate 0. As illustrated, the insulating substrate 0 is stepwise pre-heated (in the manner of gentle heating) in the zones 1 to 3 provided with IR heaters 71 to 73 with IR lamps or the like, respectively. Through this pre-heating, the insulating substrate 0 may be heated, for example, up to 400° C. or so. The insulating substrate 0 is conveyed at a running rate of from 10 to 25 mm/sec or so, into an RTA unit, which is sandwiched, for example, between a pair of Xe arc lamps 81 at its upper and lower sides. Each arc lamp 81 is covered with a reflector plate 82, and radiation thermometers 83 are disposed adjacent to the lamps. The thin semiconductor film formed on the insulating substrate 0 of glass or the like absorbs the ultraviolet rays being emitted by the arc lamps 81, and is heated at a temperature falling between 500 and 700° C. within a period of 1 second or so. After having passed through the RTA unit, the insulating substrate 0 is conveyed into a cooling zone 4 provided with an IR heater 74, and is gradually cooled therein. The processing temperature is measured with the radiation thermometers 83 disposed just before and after the RTA unit. The processing temperature is determined by the three parameters, the power of the Xe arc lamps in the RTA unit, the power of the IR heaters 71 to 73 disposed in the pre-heating zones, and the running rate of the insulating substrate 0. The optimum parameters for the RTA condition vary, depending on the material of glass used for the substrate, the thickness of the glass sheet for the substrate, and the size of the substrate. If overstepping the optimum condition, the insulating substrate 0 shall receive a great temperature gradient and will be thereby thermally shrunk. In our experiment for activation through RTA in this embodiment, we, the inventors defined four temperature conditions of 530, 590, 620 and 680° C. These temperatures were measured with the radiation thermometers 83 disposed adjacent to the RTA unit.

Figure 3:
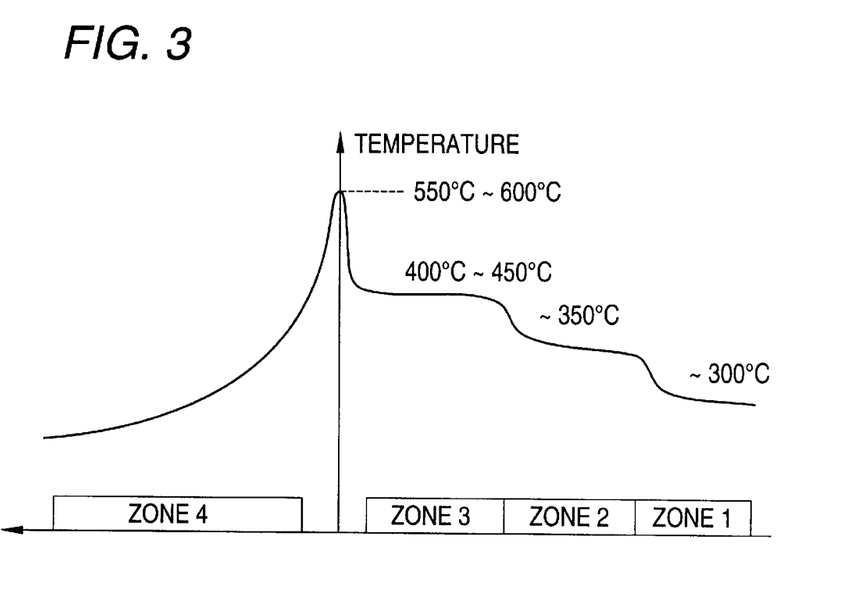
FIG. 3 is a graph showing the temperature profile in the RTA apparatus of FIG. 2.

FIG. 3 is a graph showing the temperature profile in the RTA apparatus of FIG. 2. As in the graph, the substrate is gradually heated up to about 300° C. in the zone 1, then further gradually heated up to about 350° C. in the zone 2, and still gradually heated up to a temperature falling between 400 and 450° C. or so in the zone 3 just before the RTA unit. As the case may be, the zone 1 and the zone 2 may be in one stage. After having passed through the zone 3, the insulating substrate 0 is instantaneously heated in the RTA unit up to a temperature falling between 550 and 600° C. or so. Next, this is conveyed into the zone 4, in which it is gradually cooled.

Figure 4:
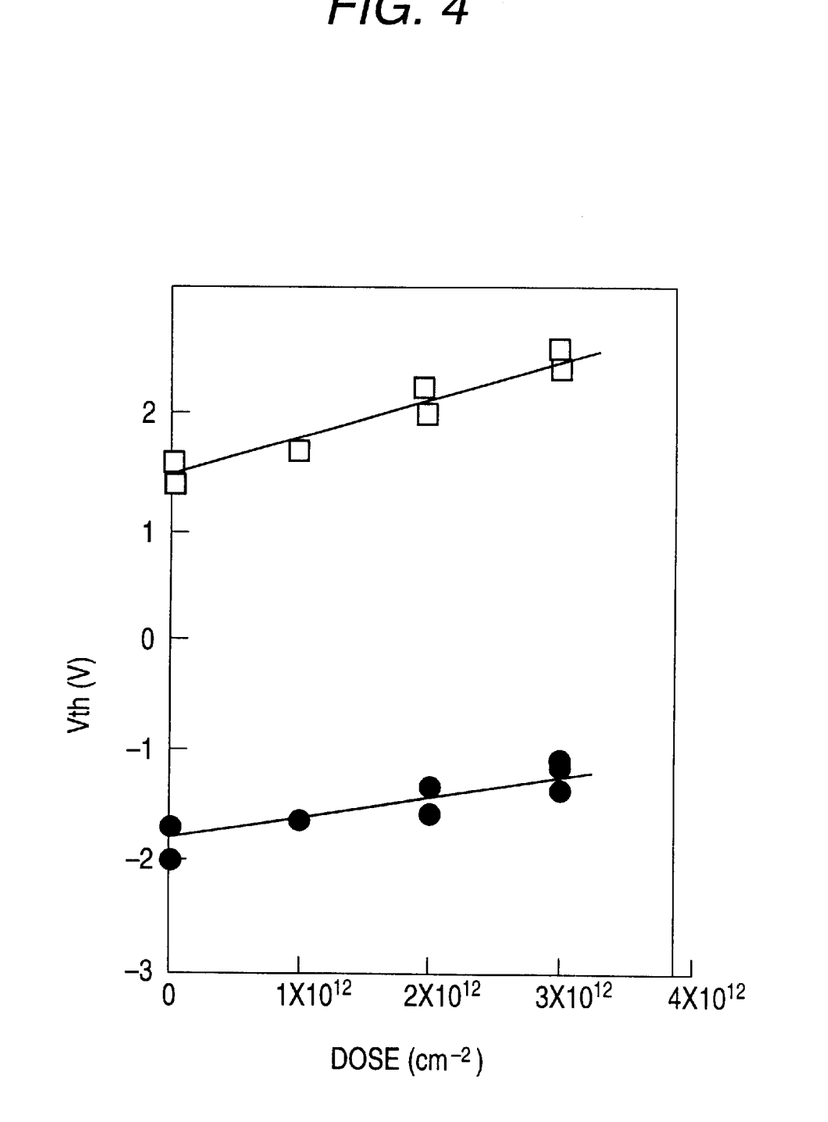
FIG. 4 is a graph showing the relationship between the Vth of thin-film transistors and the channel dose applied in fabricating the transistors.

FIG. 4 is a graph showing the relationship between the Vth of thin-film transistors and the dose of the dopant ions having been implanted into the channel region of each transistor. The dose as referred to herein is meant to indicate the dose in Vth ion implantation. For the data in FIG. 4, conventional laser annealing but not RTA was employed for dopant activation. In FIG. 4, the data represented by □ indicate Vth of n-channel thin-film transistors, and those by ● indicate Vth of p-channel thin-film transistors. For the n-channel thin-film transistors, their Vth at a boron ion (B⁺) dose of $3\times10^{12}/cm^2$ is shifted in the enhancement direction of about 0.8 V, as compared with that with no boron dose. However, at a boron ion (B⁺) dose of about $1\times10^{13}/cm^2$, the electric characteristics of the thin-film transistors are worsened. Therefore, the boron ion (B⁺) dose for Vth ion implantation must be defined to be lower than $1\times10^{13}/cm^2$, but preferably not higher than $3\times10^{12}/cm^2$. For the p-channel thin-film transistors, the dose dependency of their Vth is not so large, as compared with that of the n-channel thin-film transistors. The Vth of the p-channel thin-film transistors at a boron ion (B⁺) dose of $3\times10^{12}/cm^2$ is shifted in the depression direction of about 0.4 V, as compared with that with no boron dose.

Figure 5:
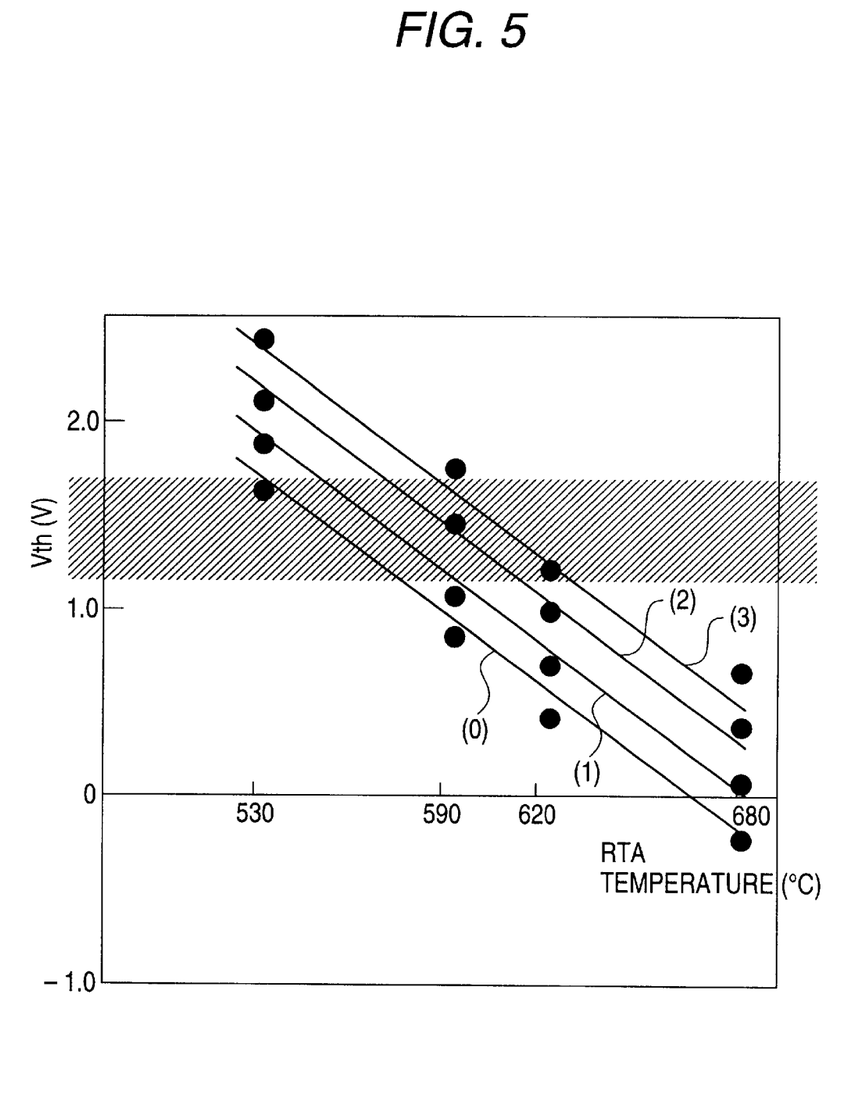
FIG. 5 is a graph showing the relationship between the Vth of thin-film transistors and the RTA temperature applied in fabricating the transistors.

As in FIG. 4, Vth of thin-film transistors depends on the dose in Vth ion implantation. Also in dopant activation through RTA, we, the inventors have found that Vth of thin-film transistors is shifted, depending on the processing temperature employed. FIG. 5 shows the RTA temperature dependency of Vth of n-channel thin-film transistors. In this, the dose in Vth ion implantation is the parameter for the line group. Precisely, the dose for the line (0) is 0 (zero, that is no dose); that for the line (1) is $1\times10^{12}/cm^2$; that for the line (2) is $2\times10^{12}/cm^2$; and that for the line (3) is $3\times10^{12}/cm^2$. The RTA temperature for those is any of four points, 530° C., 590° C., 620° C. and 680° C., as represented by ●. As is obvious from the data in FIG. 4, the Vth of the n-channel thin-film transistors is shifted in the direction of 0 V with the increase in the RTA temperature, and is also shifted in the direction of 0 V with the decrease in the dose in Vth ion implantation. In general, Vth of ideal n-channel thin-film transistors falls between 1.2 and 1.7 V or so, and this region is shadowed in FIG. 4. The reasonable range of the RTA temperature and the reasonable range of the dose in Vth ion implantation are given by the site in which the shadow region intersects the line group in FIG. 5. Concretely, at the RTA temperature of 530° C., Vth ion implantation is not needed. At the RTA temperature of 590° C., the dose for Vth ion implantation may fall between $1\times10^{12}/cm^2$ and $3\times10^{12}/cm^2$. At the RTA temperature of 620° C. or higher, the dose for Vth ion implantation shall be only $3\times10^{12}/cm^2$. Seemingly this fact may indicate that the RTA temperature of 530° C. is the best for the process simplification, as not requiring Vth ion implantation. However, higher RTA temperatures are significantly advantageous, as reducing the resistance fluctuation in the LDD region and producing more sound SiO₂ in the insulating layers. Therefore, the RTA temperature not requiring Vth ion implantation is not always the best. On the other hand, higher dose in Vth ion implantation may often fluctuate the characteristics of thin-film transistors, especially Vth thereof, and will therefore be unfavorable. For these reasons, the combination of the dose in Vth ion implantation and the RTA temperature could not be limited to only one absolute value, but shall be individually optimized depending on the characteristics of the glass substrate used and the requirements for the intended thin-film transistor devices.

Figure 6A:
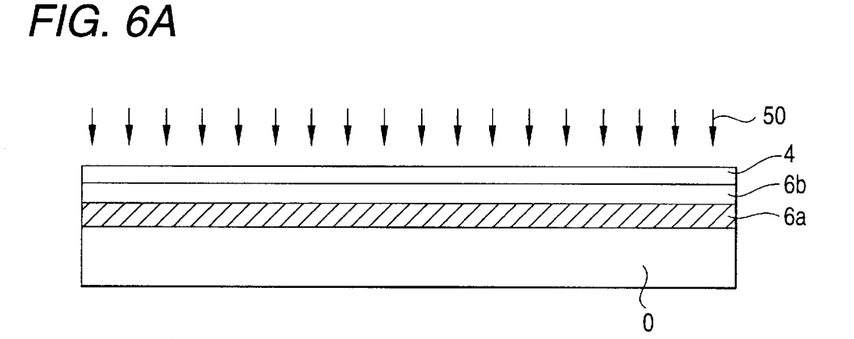
FIG. 6A to FIG. 6C are graphical views showing the second embodiment of the method for fabricating a thin-film transistor of the invention.
Figure 6B:
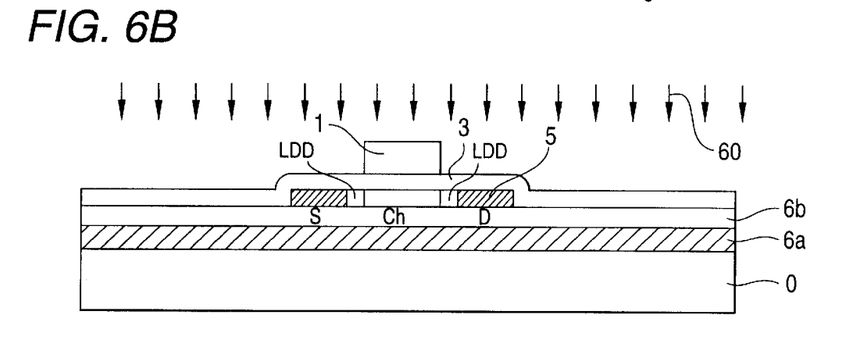
Figure 6C:
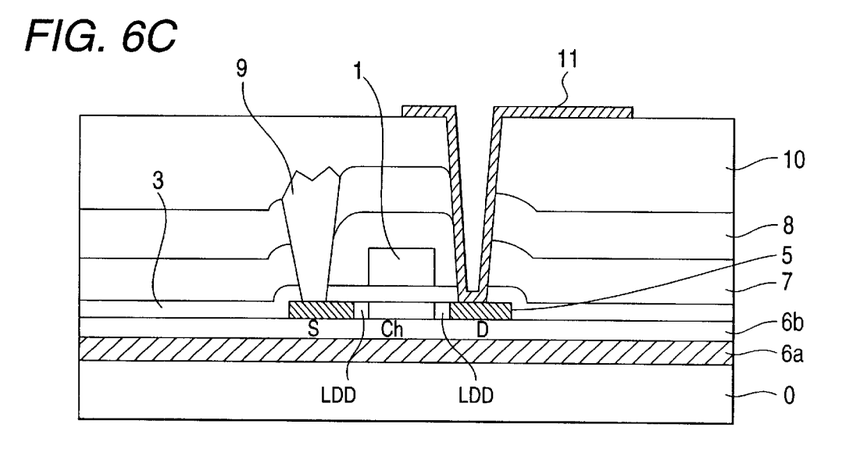

FIG. 6A to FIG. 6C show the process of one example of the second embodiment of the method of the invention for fabricating a thin-film transistor. Being different from the first embodiment mentioned hereinabove, the second embodiment is to fabricate a top-gate structured, thin-film transistor. First, as in FIG. 6A, two subbing films 6a and 6b to be a two-layered buffer layer are formed on an insulating substrate 0 through continuous PCVD. The first subbing film 6a is, for example, of $SiN_x$, and its thickness may be from 100 to 200 nm. The second subbing film 6b is, for example, of SiO₂, and its thickness may also be from 100 to 200 nm. Over the subbing film 6b of SiO₂, formed is a thin semiconductor film 4 of amorphous silicon through PCVD or LPCVD to have a thickness of from 30 to 80 nm or so. In this, the insulating substrate 0 of glass or the like has a size of, for example, 600×720 mm². After PCVD for forming the thin semiconductor film 4 of amorphous silicon thereon, the substrate is heated, for example, in a nitrogen atmosphere at a temperature falling between 400 and 450° C. for 1 hour or so for annealing the film 4, whereby hydrogen is released from the film 4. Next, the film 4 is exposed to laser rays 50, by which the amorphous silicon constituting the film 4 is crystallized to be polycrystalline silicon.

Next, as in FIG. 6B, the thin, polycrystalline silicon semiconductor film is island-wise patterned to give a thin, island semiconductor film 5. Over this, SiO₂ is grown through PCVD, normal-pressure CVD, reduced-pressure CVD, ECR-CVD, sputtering or the like to form a gate-insulating film 3 having a thickness of from 50 to 400 nm or so. If desired, boron ions B⁺ may be implanted in the thin semiconductor film 5, for example, at a dose of from $0.5\times10^{12}$ to $4\times10^{12}/cm^2$ or so through Vth ion implantation in the manner mentioned above. The accelerated voltage for this may be, for example, 80 KeV or so. As the case may be, the Vth ion implantation may be effected prior to the formation of the gate-insulating film 3. For the Vth ion implantation, for example, line beams of 620 mm in width are used. Next, on the gate-insulating film 3, formed is a film of, for example, Al, Ti, Mo, W, Ta, doped polycrystalline silicon, or their alloys to have a thickness of from 200 to 800 nm, and this is patterned to have a predetermined shape, thereby giving a gate electrode 1. Next, phosphorus ions P⁺ are implanted in the thin semiconductor film 5 through mass separation-combined ion implantation to form an LDD region. This ion implantation is directed to the entire surface of the insulating substrate 0, via the gate electrode 1 acting as a mask. The dose may fall between $6\times10^{12}$ and $5\times10^{13}/cm^2$. The channel region ch just below the gate electrode 1 is protected, in which, therefore, boron ions B⁺ having been implanted in the previous Vth ion implantation remain as they are. After the ion implantation in the LDD region, a resist pattern is formed to cover the gate electrode 1 and around it, and a high dose of phosphorus ions P⁺ are implanted in the thin semiconductor film through ion-shower doping not combined with mass separation, thereby forming a source region S and a drain region D. In this case, the dose may be, for example, $1\times10^{15}/cm^2$ or so. As the doping gas, used is a hydrogen-diluted, 20% PH₃ gas. To form a CMOS circuit, for example, the doping gas is changed to a 5 to 20% B₂H₆/H₂ gas mixture, after the formation of the resist pattern for the p-channel thin-film transistor, and the necessary ion implantation is attained at a dose of from $1\times10^{15}$ to $3\times10^{15}/cm^2$ or so. For forming the source region S and the drain region D, a mass separation-combined ion implantation apparatus may be used. This ion implantation step is followed by a next activation step of activating the dopant having been implanted in the thin semiconductor film 5. For this activation, used is RTA 60 for Vth control in the thin-film transistor being fabricated herein, as in the first embodiment mentioned above.

Finally, as in FIG. 6C, an interlayer insulating film 7 of, for example, SiO₂ having a thickness of about 600 nm is formed to cover the gate electrode 1. On the interlayer insulating film 7 thus formed, a film of, for example, $SiN_x$ is formed through PCVD to have a thickness of approximately from 100 to 400 nm or so. This is a passivation film (cap film) 8. In this stage, the thus-processed substrate is annealed, for example, in nitrogen gas at 350° C. for 1 hour or so, whereby hydrogen atoms in the interlayer insulating film 7 are diffused out into the thin semiconductor film 5. After this, a contact hole is formed, and a film of, for example, Mo, Al or the like is formed through sputtering on the passivation film 8. Then, this is patterned to have a predetermined shape, thereby giving a wiring electrode 9. Next, a planarizing layer 10 of, for example, acrylic resin or the like is formed to have a thickness of 1 μm or so, and a contact hole is formed. Over the planarizing layer 10, a transparent conductive film of, for example, ITO, IXO or the like is formed through sputtering, and is patterned to have a predetermined shape, thereby giving a pixel electrode 11.

Figure 7:
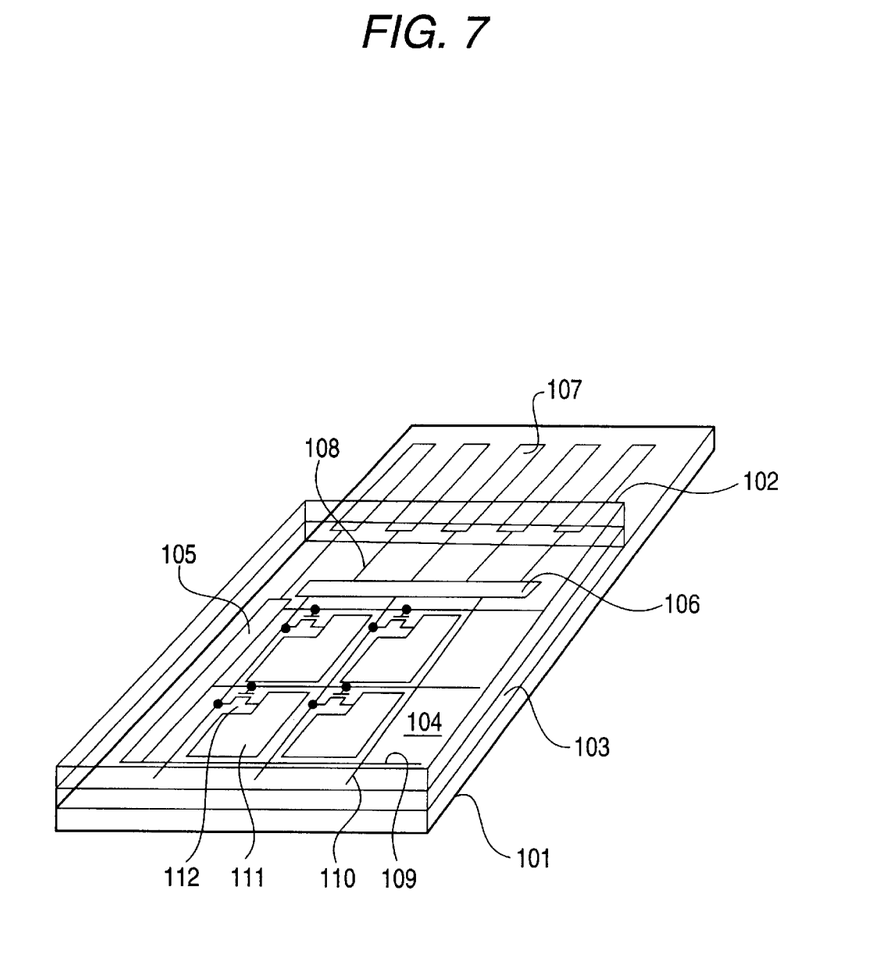
FIG. 7 is a perspective view showing one example of an active matrix-type display device, which is one application of the invention.

Last mentioned herein is one example of an active matrix-type display device comprising the thin-film transistors having been fabricated in the first and second embodiments, while referring to FIG. 7. As illustrated, the display device has a panel structure that comprises an electro-optical substance 103 as sandwiched between a pair of insulating substrates 101 and 102. As the electro-optical substance 103, for example, employed is a liquid-crystal material. On the lower insulating substrate 101, a pixel array 104 and a driving circuit are integrated. The driving circuit is partitioned into a vertical driving circuit area 105 and a horizontal driving circuit area 106. On the upper periphery of the insulating substrate 101, formed are terminals 107 for external connection. The terminals 107 are connected with the vertical driving circuit 105 and the horizontal driving circuit 106 via wire connections 108. The pixel array 104 has gate wire connections 109 in rows and signal wire connections 110 in columns. In the intersection of the two wire connections, formed are a pixel electrode 111 and a thin-film transistor 112 for driving the pixel electrode 111. The gate electrode of the thin-film transistor 112 is connected with the corresponding gate wire connection 109, the drain region thereof is with the corresponding pixel electrode 111, and the source region thereof is with the corresponding signal wire connection 110. The gate wire connections 109 are connected with the vertical driving circuit 105, while the signal wire connections 110 with the horizontal driving circuit 106. The thin-film transistor 112 for switching and driving the pixel electrode 111, and also the thin-film transistors in the vertical driving circuit 105 and the horizontal driving circuit 106 are all fabricated according to the present invention.

For Vth control in thin-film transistors, only a technique of channel doping through ion implantation has heretofore been practicable. Contrary to this knowledge, the present invention has verified that Vth ion implantation is not always necessary for Vth control in thin-film transistors, and that Vth of thin-film transistors can be well controlled by controlling the processing temperature in RTA for dopant activation. The invention, as being characterized by those findings, exhibits the effects mentioned below. The first is that Vth control in thin-film transistors is possible even when Vth ion implantation is omitted. Therefore, the process for fabricating thin-film transistors is simplified. The second is that, even when Vth ion implantation is needed, the Vth of thin-film transistors can be well controlled by controlling the condition for RTA. Therefore, the process margin in fabricating thin-film transistors is enlarged. The third is that, because of the excellent temperature uniformity in the substrates being heated for dopant activation through RTA, the degree of dopant activation is unified and the interfacial level between a thin-film transistor and an insulating film is reduced. Therefore, the Vth of thin-film transistors fabricated is prevented from fluctuating. Being characterized by those effects, the method of the invention for fabricating thin-film transistors realizes novel Vth control in the thin-film transistors fabricated therein. As a result, according to the invention, the process itself for fabricating thin-film transistors is simplified, the process margin is enlarged, and the Vth fluctuation in the thin-film transistors fabricated is reduced. Thus, the invention greatly contributes in realizing large-scale integrated circuits with peripheral driving circuits built therein that meet the severe Vth control requirements in the art.

While the invention has been described in detail and with reference to specific embodiments thereof, it will be apparent to one skilled in the art that various changes and modifications can be made therein without departing from the spirit and scope thereof.

What is claimed is:

1. A method for fabricating a thin-film transistor, which comprises the following steps:

a step of preparing a substrate, a step of forming a thin semiconductor film on said substrate, a step of forming a gate-insulating film on said substrate, said gate-insulating film having a two-layered structure of a gate nitride layer and a gate oxide layer, a step of forming a gate electrode on said substrate, a step of implanting a dopant selectively in said thin semiconductor film to form a source region and a drain region of the thin-film transistor, a controlled rapid thermal annealing (RTA) step of activating the implanted dopant for controlling the threshold voltage (Vth) of the thin-film transistor, wherein said controlled RTA step is performed at an annealing temperature which is not greater than 600° C. such that increasing the annealing temperature decreases the threshold voltage, and decreasing the annealing temperature increases the threshold voltage, a step of forming a wiring electrode in electrical contact with one of said source region and said drain region, a step of forming a passivation layer on said substrate, a step of forming a contact hole at the other one of said source region and said drain region through the passivation layer, and a step of forming a metal contact film in said contact hole.

2. The method for fabricating a thin-film transistor as claimed in claim 1, which further comprises, prior to said implantation step, a pre-implantation step of selectively implanting a dopant at least in the part of said thin-film semiconductor to be the channel region of said thin-film transistor, thereby further controlling the Vth of said thin-film transistor.

3. The method for fabricating a thin-film transistor as claimed in claim 1, wherein said controlled RTA step comprises gradually heating said substrate, then exposing said thin-film semiconductor to ultraviolet rays for rapidly heating it, and thereafter gradually cooling it.

4. A method for fabricating a display device, which comprises the following steps:

a step of preparing a first substrate, a step of forming a thin semiconductor film on said first substrate, a step of forming a gate-insulating film on said first substrate, said gate-insulating film having a two-layered structure of a gate nitride layer and a gate oxide layer, a step of forming a gate electrode on said first substrate,
a step of implanting a dopant selectively in said thin semiconductor film to form a source region and a drain region of a thin-film transistor,
a controlled rapid thermal annealing (RTA) step of activating the implanted dopant for controlling the threshold voltage (Vth) of said thin-film transistor, wherein said controlled RTA step is performed at an annealing temperature which is not greater than 600° C. such that increasing the annealing temperature decreases the threshold voltage, and decreasing the annealing temperature increases the threshold voltage,
a step of forming a wiring electrode in electrical contact with one of said source region and said drain region,
a step of forming a passivation layer on said substrate,
a step of forming a contact hole at the other one of said source region and said drain region through the passivation layer,
a step of forming a metal contact film in said contact hole
a step of connecting a plurality of said thin-film transistors with each other to give pixel electrode integration, and
a step of bonding a second substrate to an electro-optical substance, wherein said electro-optical substance is sandwiched between said first substrate and said second substrate.

5. The method for fabricating a display device as claimed in claim 4, which further comprises, prior to said implantation step, a pre-implantation step of selectively implanting a dopant at least in the part of said thin-film semiconductor to be the channel region of said thin-film transistor, thereby further controlling the Vth of said thin-film transistor.

6. The method for fabricating a display device as claimed in claim 4, wherein said controlled RTA step comprises gradually heating said substrate, then exposing said thin-film semiconductor to ultraviolet rays for rapidly heating it, and thereafter gradually cooling it.

7. The method of claim 1, wherein said thin semiconductor film has a thickness of 30–80 nm, said gate nitride layer has a thickness of about 50 nm and said gate oxide layer has a thickness of about 200 nm.

8. The method of claim 4, wherein said thin semiconductor film has a thickness of 30–80 nm, said gate nitride layer has a thickness of about 50 nm and said gate oxide layer has a thickness of about 200 nm.

* * * * *